Nov. 28, 1967 J. AVINS 3,355,669

FM DETECTOR SYSTEM SUITABLE FOR INTEGRATION IN A MONOLITHIC SEMICONDUCTOR BODY

Filed Sept. 14, 1964 2 Sheets-Sheet 1

INVENTOR.
JACK AVINS
BY
Eugene M. Whitacre
Attorney

INVENTOR.
JACK AVINS
BY Eugene M. Whitacre
Attorney

United States Patent Office 3,355,669
Patented Nov. 28, 1967

3,355,669

FM DETECTOR SYSTEM SUITABLE FOR INTEGRATION IN A MONOLITHIC SEMICONDUCTOR BODY

Jack Avins, Princeton, N.J., assignor to Radio Corporation of America, a corporation of Delaware Filed Sept. 14, 1964, Ser. No. 396,206
10 Claims. (Cl. 329—103)

ABSTRACT OF THE DISCLOSURE

A high performance frequency modulation detector system especially suited for fabrication using integrated circuit techniques includes a wide band amplifier-limiter direct current coupled to a balanced discriminator circuit, and a low frequency amplifier output circuit direct current coupled to the balanced discriminator.

This invention relates to a signal translating and demodulating system for angle modulated carrier waves. The angle modulated carrier waves to be translated and demodulated may be, but are not restricted to being, the intercarrier beat between the picture and frequency modulated sound carriers of a television signal. The term angle modulation refers to frequency modulation, phase modulation or a combination of frequency and phase modulation. More particularly, the invention relates to angle modulated carrier wave processing channels which can be fabricated using integrated circuit techniques and which are capable of performance characteristics comparable to or better than discrete component circuits of the type presently used in angle modulation receivers.

As used herein the term integrated circuit refers to a unitary or monolithic semiconductor device which is the equivalent of a network of interconnected active and passive circuit elements. At the present state of the art integrated circuits offer particular advantages in applications where small size and weight are a prime consideration and cost is of secondary importance. In other applications where the minimum space and weight is determined by other factors, such as the picture tube in television receivers, the cost factor is more important and integrated circuits are not extensively used.

The cost of an integrated circuit is, to a large extent, determined by the yield of the manufacturing process; i.e., the percentage of acceptable units which result from the total number of units made or started. Accordingly, where cost is a prime consideration the circuit to be integrated should be of a type which will exhibit the desired operation with components having wide tolerance variations. A circuit with noncritical components whose ratios are more important than their absolute values is more susceptible of high yield integrated circuit processes than circuits requiring tight tolerance components.

Another factor to be considered is that at the present time, there is no satisfactory way of providing an inductor on an integrated circuit. This means that any inductors required by the circuit will be external to the integrated circuit device, and connected thereto through contact areas. Since the use of external components defeats the advantages of integrated circuits, the number of inductors and inductor tuned circuits should be kept at a minimum. In line with the foregoing, capacitors require a considerable area on the integrated circuit chip, and accordingly the size and number of capacitors should be kept at a minimum.

A circuit embodying the invention which satisfies the foregoing requirements comprises a resistance-capacitance coupled wide band amplifier for driving a balanced discriminator which is directly coupled to an audio amplifier. All of the circuitry except for the discriminator transformer may be incorporated in an extremely tiny semiconductor chip which, when mounted, is no larger than an ordinary transistor. However, this tiny chip performs the functions of amplifying and limiting high frequency waves, recovering the modulation information, and amplifying the recovered low frequency modulation information, all without interaction.

In accordance with an embodiment of the invention the wide band amplifier comprises emitter coupled limiter stages which not only provide highly stable and symmetrical limiting of an applied carier wave, but use relatively noncritical circuit components thereby contributing to a high yield in the manufacturing processes, and resultant low cost of the device.

The emitter coupled limiter is directly coupled through an emitter follower amplifier to the discriminator transformer. The direct coupling to the discriminator transformer tends to reduce the higher order harmonics applied to the discriminator, and the emitter follower stage permits the direct coupling to the discriminator transformer without substantial reduction in the collector voltage of the emitted coupled limiter, thereby enhancing the output level and limiting of the system.

In addition to the foregoing, the discriminator is balanced so that the voltage developed at the discriminator output terminal does not change with variations in signal level or supply voltages. This feature permits direct coupling of the discriminator to an audio amplifier on the chip, and thereby eliminates the necessity for a low frequency coupling capacitor, which would require an inordinate amount of area on the surface of the chip.

The novel features which are considered to be characteristic of this invention are set forth with particularity in the appended claims. The invention itself, however, both as to its organization and method of operation as well as additional objects and advantages thereof, will best be understood from the following description when read in connection with the accompanying drawings in which:

The integrated circuit of the invention will be described in the context of a television receiver. It is to be understood, however, that the fundamental concepts to be described are more generally applicable. For example the circuit may be used in broadcast or communication receivers.

Figures 1, 3:
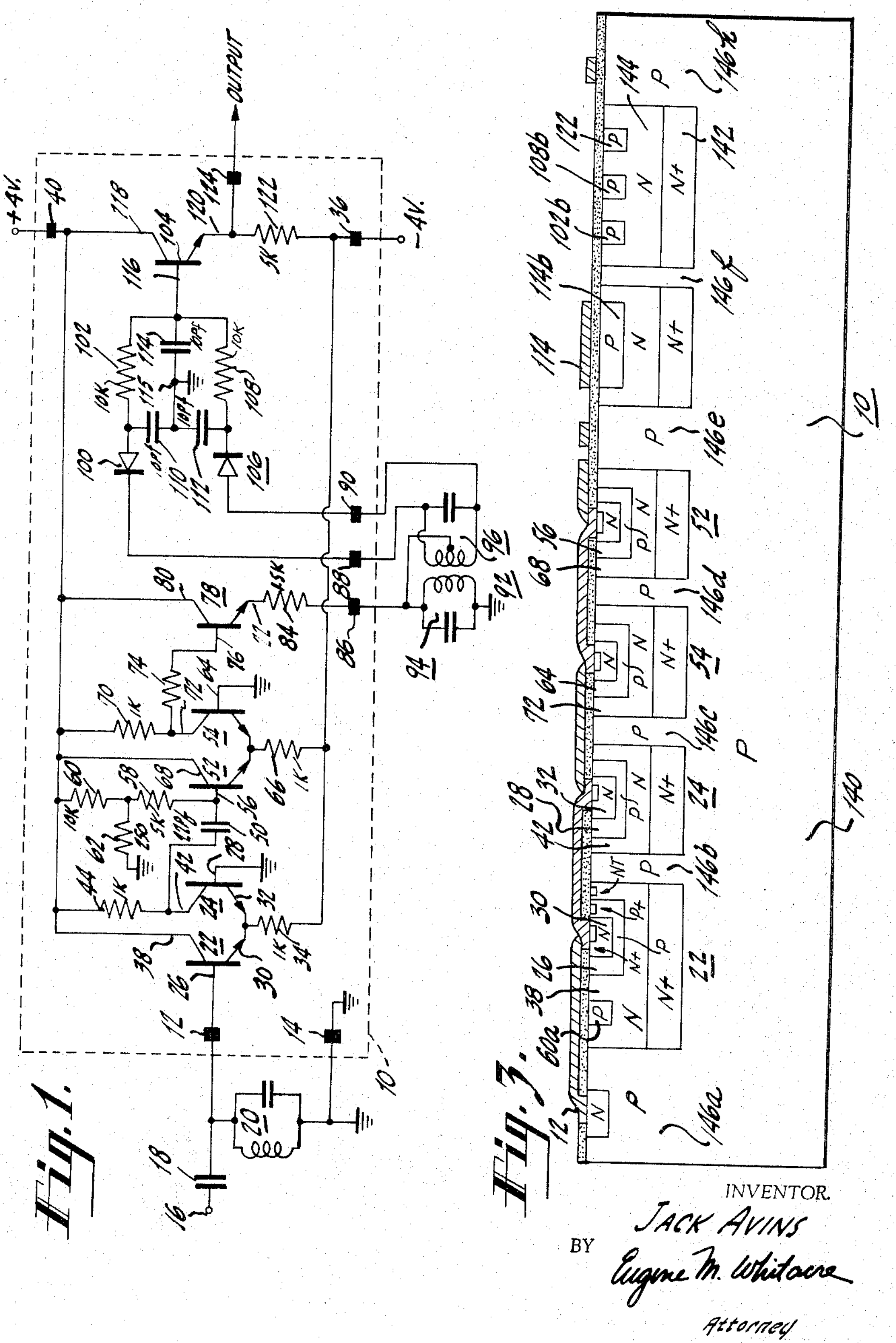
FIGURE 1 is a schematic circuit diagram of an angle modulated wave processing channel embodying the invention.
FIGURE 3 is a sectional view of the integrated circuit chip of FIGURE 2 taken on the section lines 3—3.
Figure 2:
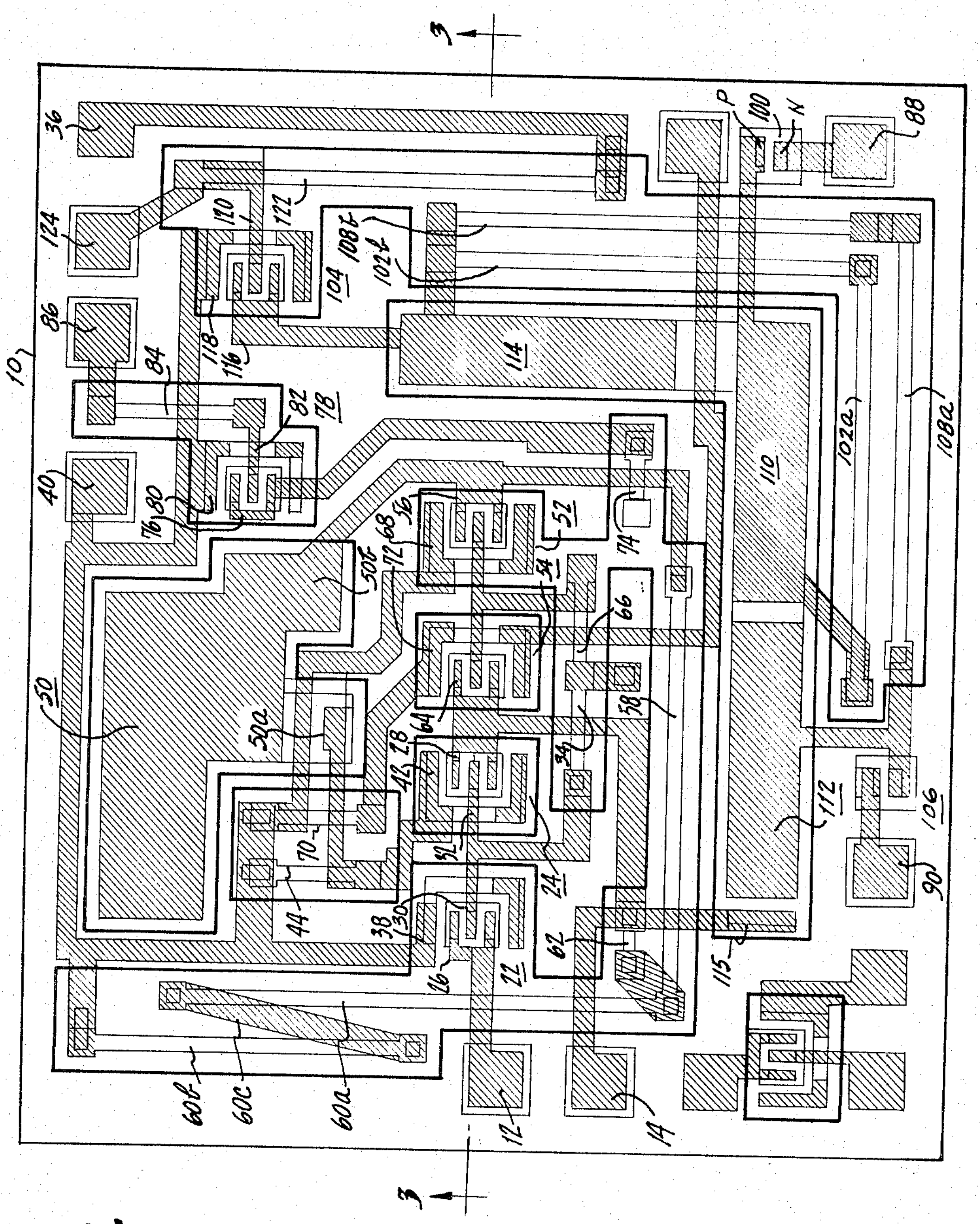
FIGURE 2 is a plan view, greatly enlarged, of an integrated circuit chip incorporating the circuit of FIGURE 1.

The schematic circuit diagram of FIGURE 1 shows an example of specific circuitry and the plan view of FIGURE 2 shows the layout of an integrated circuit chip embodying the invention. The rectangle 10 schematically illustrates a monolithic semiconductor circuit chip. The chip has a plurality of contact areas about the periphery thereof through which connections to the circuit on the chip may be made. For example, the chip 10 has a pair of contact areas 12 and 14 which are coupled to a source of FM waves. The contact area 14 provides a common or ground potential contact area which is connected with the various circuit ground connections shown on the chip. As to physical dimensions, the chip 10 may be of the order of 60 mils x 80 mils, or smaller.

FM signals from a suitable source such as a video detector or video amplifier of a television receiver are applied to a terminal 16 and coupled through a capacitor 18 to a resonant circuit 20 which is tuned to the 4.5 mc./s. intercarrier beat between the video and sound carriers of a television signal. The resonant circuit 20 and the coupling capacitor 18 in the present example are external to the chip but are coupled thereto through the contact areas 12 and 14.

The contact area 12 is directly coupled to an emitter coupled amplifier including a pair of transistors 22 and 24. The base electrode 26 of the transistor 22 is directly connected to the contact area 12 while the base electrode 28 of the transistor 24 is connected to ground, or the contact area 14. The emitter electrodes 30 and 32 of the two transistors are connected in common through a resistor 34 to contact terminal 36 which is connected to the negative supply terminal of a direct current power source, not shown. This connection is completed through the P-type regions separating the various isolations regions to be described hereinafter. The collector electrode 38 of the transistor 22 is directly connected to a contact area 40 which is adapted to be connected to the positive supply terminal of the direct current power source, while the collector electrode 42 of the transistor 24 is connected through a resistor 44 to the contact area 40.

The amplified and limited signals appearing at the collector electrode 42 are applied through a capacitor 50 to a second emitter coupled amplifier. As shown in FIGURE 2, one terminal 50*a* of the capacitor 50 comprises a diffused region in the semiconductor substrate while the other plate 50*b* comprises a conductive area overlying the diffused region 50*a* but separated therefrom by an insulating layer of material such as silicon dioxide.

The second emitter coupled amplifier includes a pair of transistors 52 and 54. The base electrode 56 of the transistor 52 is connected to the plate 50*b* of the capacitor 50 and through a pair of resistors 58 and 60 to the positive potential supply contact area 40. As shown in FIGURE 2 the resistor 60, which is diffused into the semiconductor substrate, is of relatively large resistance value and is broken into two sections 60*a* and 60*b* connected by metallization area 60*c*. A relatively small resistor 62 is connected from the junction of the resistors 58 and 60 to ground, which in this case is the contact area 14.

The base electrode 64 of the transistor 54 is grounded, and the emitters of the two transistors are connected in common through a resistor 66 to the negative voltage supply contact area 36. The collector electrode 68 of the transistor 52 is directly connected to the positive potential supply contact area 40 while a resistor 70 connects the collector electrode 72 of the transistor 54 to this contact area.

The amplified and limited signals appearing at the collector electrode 72 are coupled through a resistor 74 to the base electrode 76 of an emitter follower transistor 78. The collector electrode 80 of the transistor 78 is connected to the positive potential supply contact area 40 and the emitter electrode 82 is connected through a resistor 84 to another contact area 86. The contact 86 together with another pair of contact areas 88 and 90 are adapted to be connected to a discriminator transformer 92 which is external to the circuit chip. The discriminator transformer includes a primary circuit 94 and the secondary circuit 96 both tuned to the 4.5 mc./s. intercarrier beat signal. A direct connection is provided from the high signal potential side of the primary circuit 94 to a centertap on the secondary winding of the discriminator transformer.

The primary circuit 94 of the discriminator transformer is coupled between the contact areas 86 and 14 and the secondary circuit is coupled between the contact areas 88 and 90. The contact area 88 is connected to the cathode of a rectifier 100 whose anode is connected through a resistor 102 to an audio frequency amplifier transistor 104. As shown in FIGURE 2, resistor 102 is divided into two sections 102*a* and 102*b* which are suitably connected in the series.

The contact area 90 is connected to the anode of a rectifier 106 whose cathode is connected through a resistor 108 to the transistor 104. Again in FIGURE 2 the resistor 108 is shown in two sections 108*a* and 108*b*. A first capacitor 110 is connected between the anode of the rectifier 100 and ground, and a second capacitor 112 is connected between the cathode of the rectifier 106 and ground. A third capacitor 114 is connected between the junction of the resistors 102 and 108 and ground. As shown in FIGURE 2 the capacitors 110, 112 and 114 comprise separate conductive areas overlying, but insulated from, a diffused region in a semiconductor substrate with a common terminal 115 connecting the common diffused region to the ground contact terminal 114.

The demodulated FM signals are developed at the base electrode 116 of the transistor 104. The collector electrode 118 of the transistor 104 is directly connected to the positive potential contact area 40 and the emitter electrode 120 is connected through an emitter resistor 122 to the negative supply potential contact area 36. The audio signals developed across the resistor 122 are derived from the circuit chip at the contact area 124 with respect to a point of reference potential such as at the contact area 14.

In the operation of the circuit, the applied FM waves are symmetrically limited by the two emitter coupled amplifier stages. If greater sensitivity is required for a particular application, additional emitter coupled amplifier stages may be provided. Where the application is for television receivers, a separate sound detector and circuit therefor may also be provided on the chip if desired. It should be noted that the emitter coupled amplifiers include a minimum number of capacitors and a relatively small total value of capacitance and provides excellent operating characteristics with resistors of relatively low resistance value. In addition, the circuit component tolerances are not critical and may vary over a considerable range without substantial deterioration in the circuit performance. These amplifiers provided symmetrical limiting even in the presence of wide changes in applied signal level and in power supply voltages. The symmetrical limiting and wide band operation contribute significantly to the immunity of the circuit-to-noise disturbances. Bursts of noise at the input circuit are prevented from causing rectification and shifting the axis of limiting so that noise cannot introduce undesirable phase modulation.

The limited output wave appearing at the collector electrode 72 of the transistor 54 is substantially a square wave and hence contains harmonics of the fundamental 4.5 mc./s. FM wave. It is desirable from two standpoints to directly couple the transistor 54 to the discriminator transformer, as opposed to capacitively coupling these two points. First, if capacitive coupling is used, considerable area is required on the integrated circuit chip as can be seen by the relative areas occupied by the capacitors 50, 110, 112 and 114 of FIGURE 2. Second, it is desirable to attenuate the harmonic components of the limited wave which tend to unbalance the discriminator circuit. In this regard, the direct coupling of the discriminator transformer to the emitter coupled limiter stage 52–54 provides significant attenuation of the harmonics of the fundamental FM carrier as compared to capacitive coupling. If capacitive coupling were used, significantly less attenuation of the harmonics is achieved.

The emitter follower stage including the transistor 78 serves to provide a low impedance driving source for the discriminator transformer 92, and also prevents division of the voltage appearing at the collector electrode 72. With respect to the latter point, it may be noted that direct coupling of the collector electrode 72 to the discriminator primary circuit 94 without the emitter follower circuit can significantly reduce the voltage at the collector electrode 72 thereby reducing the voltage swing at the collector electrode 72.

The discriminator network is balanced and is operative to recover the modulation information from the FM carrier in a conventional manner. The discriminator is balanced so that the output voltage applied to the base electrode 116 of the transistor 104 does not vary with changes in signal level or with power supply voltage variations. This feature permits direct coupling of the discriminator network to the audio frequency amplifier transistor 104. As stated above, capacitive coupling of the discriminator network to the audio amplifier would require a large coupling capacitor which would occupy an inordinate amount of space on the integrated circuit chip.

The audio frequency signals are translated through the transistor 104 and developed across the resistor 122 for use in driving succeeding amplifier stages, such as power output stages. The direct current return path for the transistor 104 is completed through the discriminator network to ground at the bottom of the discriminator transformer primary circuit 94. Although the power supply is indicated as being plus four volts at the contact area 40, ground at the contact area 14, and minus four volts at the contact area 36, it is to be understood that these voltages could be changed to plus eight, plus four, and zero volts at the contact areas 40, 14, and 36 respectively. Other voltage levels can be used.

With reference to FIGURE 2, the cross-hatched areas represent metallized conductors; the other lined areas represent junctions between differing conductivity-types of semiconductor material; and the heavy lines indicate the boundaries of different isolation regions. To electrically isolate one area, i.e. one portion of the circuit on the chip from another, a diffusion step is provided in the manufacture of the chip so that the various islands of one conductivity type are separated one from the other by semiconductor material of an opposite conductivity type.

FIGURE 3 is a diagrammatic representation, in cross-section, of a portion of the integrated circuit chip 10. Initially the substrate 140 of semiconductor material which is of a P-type impurity concentration, has deposited thereon successively, an N+ and an N type epitaxial layers 142 and 144 respectively. By suitably masking, oxidizing and etching techniques which are well-known in the art, the isolated regions are formed by diffusing a P-type impurity into selected areas on the wafer such as the zones **146*a*–146*h*. As shown in FIGURE 3, this P-type diffusion for the regions 146*a*–146*h*** is continued through the N and N+ epitaxial layers to the P-type substrate. Since the P type material completely surrounds islands of N type material on the wafer, the resulting P–N junction can be backbiased to provide the desired isolation of one N island from another.

The various transistors are then formed by using appropriate masks and diffusing P-type base regions into appropriate ones of the islands. For example, the base regions 26, 28, 64 and 56 shown in FIGURE 3 has formed in this step. At the same time the various resistors and the substrate plates of the various capacitors can be formed. FIGURE 3, shows a cross-section of the resistors **60*a*, 102*b*, 108*b* and 122, and the substrate plate 114*b* of the capacitor 114**. As is known, the resistivity value of the semiconductor material is dependent on the impurity concentration, and the resistance of various resistors is established by the dimensions of the various resistors for a given time and temperature of diffusion.

The emitter regions such as at 30 and 32 of FIGURE 3 are diffused into the base regions by using appropriate masks. N+, P+ and N+ contact areas are formed in the collector base and emitter regions respectively, as well as P+ areas for the terminals of the resistors and capacitors to facilitate in making low resistance electrical connections thereto.

The various contact areas 12, 14, 40, 86, 88 and 90 (not shown) are formed at the same time as the emitter diffusion, and are of N-type impurity located in the P-type substrate regions about the periphery of the chip 10. The contact area 36 (not shown) is formed directly on the P-type substrate region. Hence connections can be made to the contact area 36 by connecting to any portion of the P-type isolating or substrate material, such as is done from the junction of the resistors 34 and 66.

The resistors and capacitors can be formed by other methods on the chip. For example, the resistors and bottom plate of the capacitors may be deposited as by evaporation of a suitable material. Alternatively the capacitors, such as the capacitors 110 and 112 can be backbiased diodes. In the case of the capacitors 110 and 112, the anodes of the diodes are grounded, and the reverse bias is the positive voltage developed at the base of the transistor 104.

What is claimed is:

1. A signal translating and demodulating system for angle modulated carrier waves to be incorporated as an integrated circuit on a wafer of semiconductor material comprising:
   - a wide band amplifier-limiter circuit including first and second emitter coupled transistors for connection to a source of angle modulated carrier waves;
   - a balanced discriminator circuit including a discriminator transformer coupled to receive and demodulate the amplitude limited angle modulated waves from said amplifier limiter circuit; and
   - a low frequency amplifier circuit direct current conductively connected to said discriminator circuit; all of said circuits except for said discriminator transformer being incorporated in a single semiconductor wafer.

2. A signal translating and demodulating system for angle modulated carrier waves to be incorporated as an integrated circuit on a wafer of semiconductor material;
   - a wide band amplifier-limiter circuit including a first emitter coupled transistor limiter stage coupled in cascade to a second emitter coupled transistor limiter stage each of said stages including a pair of transistors;
   - means providing an operating voltage supply connected to said transistors for applying biasing potentials thereto;
   - a balanced discriminator circuit coupled to receive amplitude limited signals from said second emitter coupled limiter stage, said balanced discriminator circuit including a discriminator transformer and an output terminal at which is developed audio frequency signals corresponding to the modulation information of said angle modulated carrier waves, said output terminal providing a substantially constant direct output voltage in response to variations in the amplitude of signals applied to said amplifier-limiter circuit and to variations in the supply voltage for said transistors; and
   - an audio frequency amplifier directly connected to said output terminal; all of said circuits except for said discriminator transformer being incorporated on a single semiconductor wafer.

3. A signal translating and demodulating system as defined in claim 2 wherein said balanced discriminator circuit is coupled to receive said amplitude limited signals from said second emitter coupled limiter stage by way of a direct current conductive signal path including an emitter follower transistor circuit.

4. A signal translating and demodulating system for angle modulated carrier waves to be incorporated as an integrated circuit on a wafer of semiconductor material comprising:
   - a wide band amplifier-limiter circuit including a first emitter coupled transistor limiter stage coupled in cascade to a second emitter coupled transistor limiter stage, each of said stages including a pair of transistors;
   - means providing an operating potential supply terminal connected to said transistors for applying biasing potentials thereto;

an emitter follower transistor stage directly coupled to said second emitter coupled limiter stage to receive amplitude limited signals therefrom;

a balanced discriminator circuit including a discriminator transformer directly coupled to said emitter follower stage, the direct coupling of said discriminator circuit through said emitter follower being effective to reduce the harmonics of said angle modulated carrier wave, and said emitter follower being effective to permit substantially the full swing of the operating potential at the output of said second emitter coupled amplifier stage; all of said circuits except for said discriminator transformer being incorporated on a single semiconductor wafer.

5. A signal translating and demodulating system for angle modulated carrier waves to be incorporated as an integrated circuit on a wafer of semiconductor material comprising;

a wide band amplifier-limiter circuit including a first emitter coupled transistor limiter stage coupled in cascade to a second emitter coupled transistor limiter stage each of said stages including a pair of transistors;

means providing an operating voltage supply connected to said transistors for applying biasing potentials thereto;

a balanced discriminator circuit directly coupled to receive amplitude limited signals from said second emitter coupled limiter stage and thereby eliminate harmonics of said angle modulated carrier waves, said balanced discriminator circuit including a discriminator transformer and an output terminal at which is developed audio frequency signals corresponding to the modulation information of said angle modulated carrier wave, said output terminal providing a substantially constant direct output voltage in response to variations in the amplitude of signals applied to said amplifier limiter circuit and to variations in the supply voltage for said transistors; and an audio frequency amplifier directly connected to said output terminal; all of said circuits except for said discriminator transformer being incorporated on a single semiconductor wafer.

6. A signal translating and demodulating system for angle modulated carrier waves to be incorporated as an integrated circuit on a wafer of semiconductor material comprising:

a wide band amplifier-limiter circuit including first and second transistors each having base, emitter and collector electrodes, means for applying an angle modulated signal between the base electrode of said first transistor and a first potential terminal, means for coupling the base electrode of said second transistor to said first potential terminal, a first resistive element connected between the emitter electrode of said first and second transistors and a second potential terminal, means connecting the collector electrode of said first transistor to an operating potential supply terminal, a second resistive element connected between the collector electrode of said second transistor and said operating potential supply terminal, third and fourth transistors each having base, emitter and collector electrodes, means coupling the collector electrode of said second transistor to the base electrode of said third transistor, means coupling the base electrode of said fourth transistor to said first potential terminal, a third resistive element connected between the emitter electrodes of said third and fourth transistors and said second potential terminal, means connecting the collector electrode of said third transistor to said operating potential supply terminal, a fourth resistive element connected between the collector electrode of said fourth transistor and said operating potential supply terminal, a fifth transistor having base, emitter and collector electrodes, means connecting the collector electrode of said fourth transistor to the base electrode of said fifth transistor, means connecting the collector electrode of said fifth transistor to said operating potential supply terminal, a discriminator transformer having a primary winding and a centertapped secondary winding both tuned to the frequency of said angle modulated carrier waves by a tuning means, a fifth resistive element connected between the emitter electrodes of said fifth transistor and one end of said primary winding, the other end of said primary winding being connected to said first potential terminal, means providing a direct connection between said center-tap of said secondary winding and the junction of said fifth resistive element with said primary winding, a first rectifier and a sixth resistive element connected in series between one end terminal of said secondary winding and an output terminal, a second rectifier and a seventh resistive element connected in series between the other end terminal of said secondary winding and said output terminal, said first and second rectifiers being oppositely poled in said circuit, a first capacitor connected between the junction of said first rectifier and sixth resistive element and said first potential terminal, and a second capacitor connected between the junction of said second rectifier and seventh resistive element and said first potential terminal, a sixth transistor having emitter, base and collector electrodes, means connecting said collector electrode to said operating potential supply terminal, an eighth resistive element connecting said emitter electrode to said second potential terminal, said base electrode being connected to said output terminal so that the emitter base current path of said fifth transistor is completed through said discriminator circuit, said primary winding and said eighth resistive element, and means for deriving a demodulated signal from the emitter electrode of said fifth transistor, all of said components except for said discriminator transformer and said tuning means being incorporated on a single semiconductor wafer.

7. A signal translating and demodulating system for angle modulated carrier waves to be incorporated as an integrated circuit on a wafer of semiconductor material comprising:

a wide band amplifier-limiter circuit including first and second transistors each having base, emitter and collector electrodes, means for applying an angle modulated signal between the base electrode of said first transistor and a first potential terminal, means for coupling the base electrode of said second transistor to said first potential terminal, a first resistive element connected between the emitter electrode of said first and second transistors and a second potential terminal, means connecting the collector electrode of said first transistor to an operating potential supply terminal, a second resistive element connected between the collector electrode of said second transistor and said operating potential supply terminal, third and fourth transistors each having base, emitter and collector electrodes, means coupling the collector electrode of said second transistor to the base electrode of said third transistor, means coupling the base electrode of said fourth transistor to said first potential terminal, a third resistive element connected between the emitter electrodes of said third and fourth transistors and said second potential terminal, means connecting the collector electrode of said third transistor to said operating potential supply terminal, a fourth resistive element connected between the collector electrode of said fourth transistor and said operating potential supply terminal, a fifth transistor having base, emitter and collector electrodes, means connecting the collector electrode of said fourth transistor to the base electrode of said fifth transistor, means connecting the collector electrode of said fifth transistor to said operation potential supply terminal, a discriminator transformer having a primary winding and a centertapped secondary winding both tuned to the frequency of said angle modulated carrier waves by a tuning means, means connecting the primary winding of said discriminator transformer in the emitter-to-collector current path of said fifth transistor, means providing a signal coupling connection to the centertap of said secondary winding from said primary winding, first and second rectifier devices connected to opposite end terminals of said secondary winding to provide a discriminator circuit, a sixth transistor having emitter, base and collector electrodes, a resistor connected between said emitter and collector electrodes of said sixth transistor, and with said base electrode of said sixth transistor being direct current conductively connected to said discriminator circuit to receive demodulated signals therefrom all of said components except for said discriminator transformer, said tuning means, and said primary winding connecting means being incorporated on a single semiconductor wafer.

8. A signal translating and demodulating system for angle modulated carrier waves to be incorporated as an integrated circuit on a wafer of semiconductor material comprising:

a wide band amplifier-limiter circuit including a first emitter coupled transistor limiter stage coupled in cascade to a second emitter coupled transistor limiter stage, each of said stages including a pair of transistors; and a balanced discriminator circuit including a discriminator transformer direct current conductively coupled to said second emitter coupled limiter stage, the current coupling of said discriminator circuit to said second emitter coupled limiter stage being effective to reduce the harmonics of said angle modulated carrier wave; all of said circuits except for said discriminator transformer being incorporated on a single semiconductor wafer.

9. A signal translating and demodulating system for angle modulated carrier waves to be incorporated as an integrated circuit on a wafer of semiconductor material comprising:

a wide band amplifier-limiter circuit including a first emitter coupled transistor limiter stage coupled in cascade to a second emitter coupled transistor limiter stage, each of said stages including a pair of transistors;

a balanced discriminator circuit including a discriminator transformer direct current conductively coupled to said second emitter coupled limiter stage, the direct current coupling of said discriminator circuit to said second emitter coupled limiter stage being effective to reduce the harmonics of said angle modulated carrier wave; and a low frequency amplifier circuit including a transistor having base, emitter and collector electrodes, an output circuit for said low frequency amplifier circuit connected between said collector and emitter electrodes, and means connecting said balanced discriminator circuit between said base and emitter electrodes for applying demodulated signals to said low frequency amplifier and for providing a direct current path for the base-emitter current of said low frequency amplifier circuit; all of said circuits except for said discriminator transformer being incorporated on a single semiconductor wafer.

10. A signal translating and demodulating system for angle modulated carrier waves to be incorporated as an integrated circuit on a wafer of semiconductor material comprising:

a wide band amplifier-limiter circuit including first and second emitter coupled transistors for connection to a source of angle modulated carrier waves;

an emitter follower transistor circuit direct current conductively coupled to said wide band circuit to receive amplitude limited signals therefrom;

a balanced discriminator circuit including a discriminator transformer direct current conductively coupled to receive and demodulate the amplitude limited angle modulated waves from said emitter follower circuit; and a low frequency amplifier circuit direct current conductively coupled to said discriminator circuit; all of said circuits except for said discriminator transformer being incorporated in a single semiconductor wafer.

References Cited

UNITED STATES PATENTS

| | | | |
|---|---|---|---|
| 2,747,455 | 5/1956 | Spracklen et al. | 330—16 X |
| 2,912,573 | 11/1959 | Mitchell | 329—134 X |
| 3,102,985 | 9/1963 | Hafner et al. | 330—16 |
| 3,213,380 | 10/1965 | Husher et al. | 329—101 |
| 3,284,713 | 11/1966 | Bailey | 307—885.5 |
| 3,290,608 | 12/1966 | Gschwandtner | 329—103 |

NATHAN KAUFMAN, *Acting Primary Examiner.*

A. L. BRODY, *Examiner.*